US012702039B2

(12) United States Patent
Ito et al.

(10) Patent No.: US 12,702,039 B2
(45) Date of Patent: Aug. 4, 2026

(54) METHOD OF PRODUCING MICRO-LED PANEL

(71) Applicant: Sharp Display Technology Corporation, Kameyama City (JP)

(72) Inventors: Kenya Ito, Kameyama City (JP); Yoshiyuki Harumoto, Kameyama City (JP)

(73) Assignee: SHARP DISPLAY TECHNOLOGY CORPORATION, Kameyama City (JP)

( * ) Notice: Subject to any disclaimer, the term of this patent is extended or adjusted under 35 U.S.C. 154(b) by 379 days.

(21) Appl. No.: 18/603,263

(22) Filed: Mar. 13, 2024

(65) Prior Publication Data

US 2024/0339440 A1 Oct. 10, 2024

(30) Foreign Application Priority Data

Apr. 4, 2023 (JP) ................................. 2023-060752

(51) Int. Cl.
H10W 72/00 (2026.01)
H10H 20/01 (2025.01)
H10H 20/857 (2025.01)

(52) U.S. Cl.
CPC .. H10W 72/07227 (2026.01); H10H 20/0364 (2025.01); H10H 20/857 (2025.01); *H10H 20/0363* (2025.01)

(58) Field of Classification Search
CPC ............ H10W 72/07227; H10H 20/85; H10H 20/8502; H10H 20/8504; H10H 20/8508; H10H 20/857
See application file for complete search history.

(56) References Cited

U.S. PATENT DOCUMENTS

| | | | | |
|---|---|---|---|---|
| 9,462,693 | B2 * | 10/2016 | Okamoto | H05K 1/181 |
| 9,997,467 | B2 * | 6/2018 | Shao | H10W 46/00 |
| 10,269,776 | B2 * | 4/2019 | Lai | H10W 90/00 |
| 10,998,480 | B2 * | 5/2021 | Torrents Abad | H10H 20/857 |
| 2022/0131059 | A1 | 4/2022 | Yamada | |

FOREIGN PATENT DOCUMENTS

JP           2021-15177 A        2/2021

* cited by examiner

*Primary Examiner* — Eric A. Ward
(74) *Attorney, Agent, or Firm* — Keating & Bennett, LLP

(57) ABSTRACT

Provided is a method of producing a micro-LED panel that can produce a micro-LED panel with excellent display quality by reducing misalignment of micro-LED chips and can achieve an increased yield. The method of producing a micro-LED panel includes: producing a micro-LED chip including a micro-LED, a first contact electrode, and a light blocking component; producing an array substrate including a switching element, a second contact electrode, and an insulating film; and placing the micro-LED chip on the array substrate. The light blocking component includes a bump with an inclined surface. The insulating film includes a dent with an inclined surface. The placing of the micro-LED chip includes electrically connecting the first contact electrode to the second contact electrode by making the bump of the light blocking component opposite to the dent of the insulating film.

7 Claims, 14 Drawing Sheets

120

110    110    110    110    101

130

110    110    120 110    110    101

140    UV1

UV2

110    110    130 120 110    110    101

130    120

110    110    110    110    101

METHOD OF PRODUCING MICRO-LED PANEL

CROSS-REFERENCE TO RELATED APPLICATIONS

The present application claims priority under 35 U.S.C. § 119 to Japanese Patent Application No. 2023-060752 filed on Apr. 4, 2023, the contents of which are incorporated herein by reference in their entirety.

BACKGROUND OF THE INVENTION

Field of the Invention

The following disclosure relates to methods of producing a micro-LED panel.

Description of Related Art

LED panels using light emitting diodes (LEDs) as light emitting elements are known. Studies have been made to make conventional display panels into higher definition display panels using micro-LEDs, which provide higher definition than the LEDs.

JP 2021-15177 A discloses a display device comprising: a substrate; a drive transistor that is provided above the substrate; a first insulating layer that is provided above the substrate so as to cover the drive transistor; a first mounting electrode that is arranged above the first insulating layer, and receives a signal having a controlled current value from the drive transistor; and a light emitting element that is mounted on the first mounting electrode and has a first electrode and a second electrode, the first electrode being electrically connected to the first mounting electrode, wherein the first mounting electrode and the first electrode are made of a metal material and joined to each other, and the first mounting electrode has at least one first through hole at a position overlapping the first electrode in plan view.

BRIEF SUMMARY OF THE INVENTION

Examples of a method of mounting micro-LEDs on an array substrate include a method including fabricating micro-LED chips on a supporting substrate, picking up the micro-LED chips and placing them on an array substrate on which switching elements, conductive lines, and other components have been formed, and connecting the micro-LED chips to the components with a metal bonding material, for example. However, micro-LED chips, being minute, are sometimes off the predetermined positions when placed. This may make the connection between the micro-LED chips and the switching elements or other components insufficient, so that the device may not operate correctly. In addition, when many micro-LED chips go off the predetermined positions, luminance unevenness occurs during the display state of the panel to degrade the display quality. This may decrease the yield of the product to lead to an increase in cost.

JP 2021-15177 A discloses a technique of providing a through hole to irradiate, through the through hole, the first electrode of the light emitting element directly with laser light required for metal bonding of the first mounting electrode and the first electrode. This can strengthen the bond between the first mounting electrode and the first electrode. On the other hand, the technique requires patterning for the through hole, meaning that an additional step is required, which leads to a long production lead time and increased production cost. JP 2021-15177 A does not mention the issue of micro-LED chip misalignment, leaving room for improvement.

In response to the above issues, an object of the present invention is to provide a method of producing a micro-LED panel that can produce a micro-LED panel with excellent display quality by reducing misalignment of micro-LED chips and can achieve an increased yield.

(1) One embodiment of the present invention is directed to a method of producing a micro-LED panel, the method including: producing a micro-LED chip including a micro-LED, a first contact electrode electrically connected to the micro-LED, and a light blocking component surrounding the micro-LED; producing an array substrate including a switching element, a second contact electrode electrically connected to the switching element, and an insulating film formed on the second contact electrode with part of the second contact electrode being exposed; and placing the micro-LED chip on the array substrate, the light blocking component including a bump with an inclined surface, the insulating film including a dent with an inclined surface, the placing of the micro-LED chip including electrically connecting the first contact electrode to the second contact electrode by making the bump of the light blocking component opposite to the dent of the insulating film.

(2) In an embodiment of the present invention, the method includes the process (1), and the producing of a micro-LED chip includes producing the light blocking component with an inclined surface by overlaying a half-tone mask whose transmittance changes in stages on a photosensitive resin composition and exposing the photosensitive resin composition to light through the half-tone mask.

(3) In an embodiment of the present invention, the method includes the process (2), and the half-tone mask is provided with light blockers and slits each formed between the light blockers, and the light blockers include light blockers with different widths.

(4) In an embodiment of the present invention, the method includes the process (2), and the half-tone mask includes regions with different evaporated metal densities.

(5) In an embodiment of the present invention, the method includes the process (2), and the half-tone mask includes a stack of semi-transparent films.

(6) In an embodiment of the present invention, the method includes any one of the processes (1) to (5), and the micro-LED chip includes a wavelength conversion layer, the micro-LED, and the first contact electrode in the stated order.

(7) In an embodiment of the present invention, the method includes any one of the processes (1) to (5), and the micro-LED chip includes the micro-LED, a wavelength conversion layer, and the first contact electrode in the stated order.

The present invention can provide a method of producing a micro-LED panel that can produce a micro-LED panel with excellent display quality by reducing misalignment of micro-LED chips and can achieve an increased yield.

DETAILED DESCRIPTION OF THE INVENTION

Hereinafter, an embodiment of the present invention is described. The present invention is not limited to the contents of the following embodiment. The design may be modified as appropriate within the range satisfying the configuration of the present invention. In the following description, components having the same or similar functions in different drawings are commonly provided with the same reference sign so as to appropriately avoid repetition of description. The structures in the present invention may be combined as appropriate without departing from the gist of the present invention.

Herein, the "viewer side" means the side closer to the viewer than a component in question when the component in question is placed opposite to the viewer, and the "back surface side" means the side of the component in question farther from the viewer.

The following describes a method of producing a micro-LED panel according to an embodiment with reference to the drawings. The method of producing a micro-LED panel according to the embodiment includes producing micro-LED chips, producing an array substrate, and placing the micro-LED chips on the array substrate.

Figure 1:
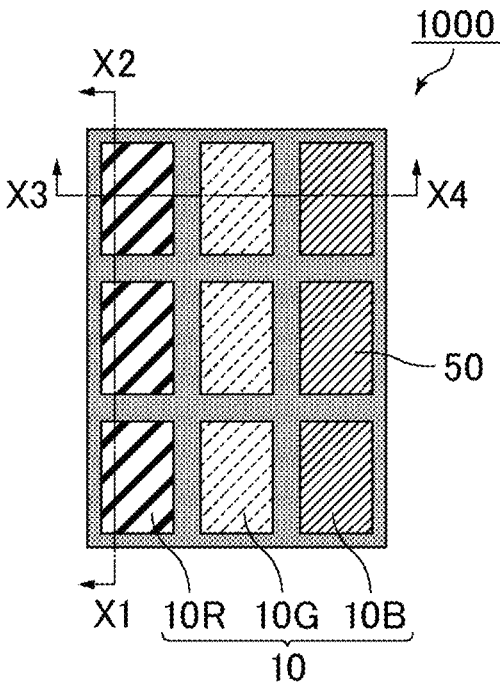
FIG. 1 is a schematic plan view of part of a micro-LED panel of an embodiment.
Figure 2:
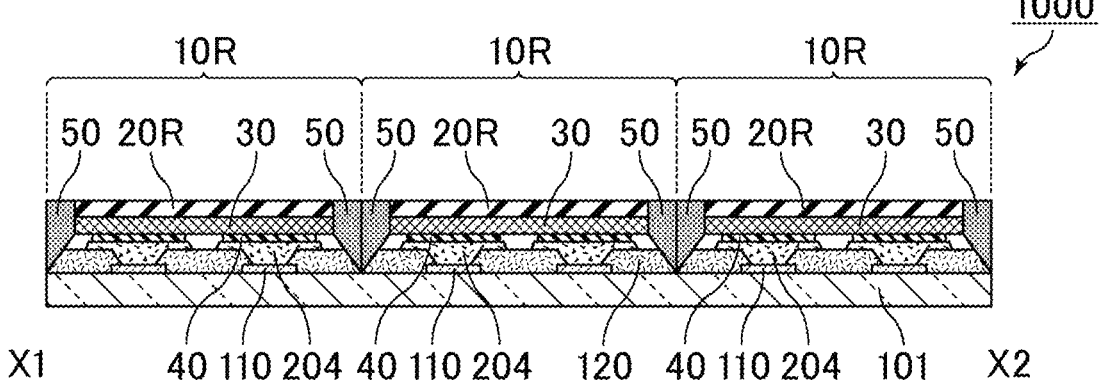
FIG. 2 is a schematic cross-sectional view taken along X1-X2 line for the micro-LED panel shown in FIG. 1.
Figure 3:
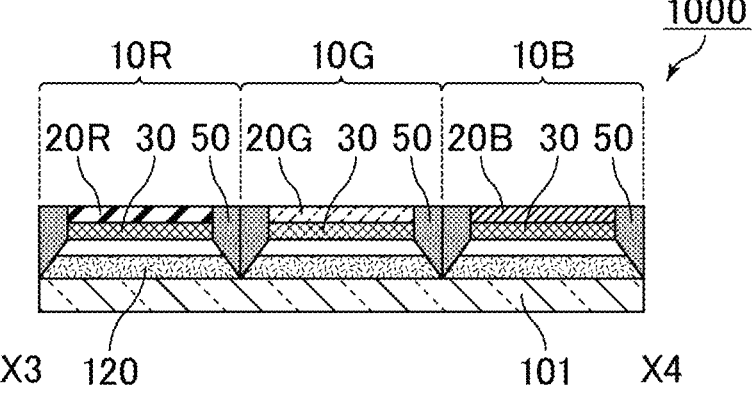
FIG. 3 is a schematic cross-sectional view taken along X3-X4 line for the micro-LED panel shown in FIG. 1.

FIG. 1 is a schematic plan view of part of a micro-LED panel of an embodiment. FIG. 2 is a schematic cross-sectional view taken along X1-X2 line for the micro-LED panel shown in FIG. 1. FIG. 3 is a schematic cross-sectional view taken along X3-X4 line for the micro-LED panel shown in FIG. 1.

As shown in FIG. 1, a micro-LED panel 1000 includes micro-LED chips 10 mounted on an array substrate 100. The micro-LED panel 1000, in a plan view, may include the micro-LED chips 10 placed in one-to-one correspondence with pixels in a matrix pattern. The array substrate 100 may include a display region in which the micro-LED chips 10 are placed and a frame region surrounding the display region. FIG. 1 is also an enlarged schematic plan view of part of the display region.

Herein, the micro-LED chips 10 are elements to be picked up in mounting on the array substrate. The micro-LED chips 10 are preferably 100 μm or smaller in at least one of a length or width, and are more preferably 100 μm or smaller in both a length and a width.

As shown in FIG. 2, a first contact electrode 40 of each micro-LED chip 10 and a corresponding second contact electrode 110 of the array substrate 100 are electrically connected to each other with a bonding material 204 such as solder. Preferably, the bump of each light blocking component 50 of the micro-LED chip 10 is opposite to a dent of an insulating film 120 of the array substrate 100. Also preferably, at least part of the inclined surface of the bump of the light blocking component 50 and at least part of the inclined surface of the corresponding dent of the insulating film 120 are in contact with each other.

The micro-LED chips 10 are self-luminous elements, and may include, for example, red micro-LED chips 10R which emit red light to the viewer side, green micro-LED chips 10G which emit green light to the viewer side, and blue micro-LED chips 10B which emit blue light to the viewer side. This configuration enables full-color display. Herein-below, the red micro-LED chips 10R, the green micro-LED chips 10G, and the blue micro-LED chips 10B are simply referred to as micro-LED chips 10 when no distinction is made among them.

FIG. 1 to FIG. 3 show an example of stripe arrangement where micro-LED chips of different colors are arranged in one of the row direction and the column direction of the micro-LED panel 1000 and micro-LED chips of the same color are arranged in the other of the row direction and the column direction. However, the arrangement of the colors of the micro-LED chips is not limited.

Figure 4:
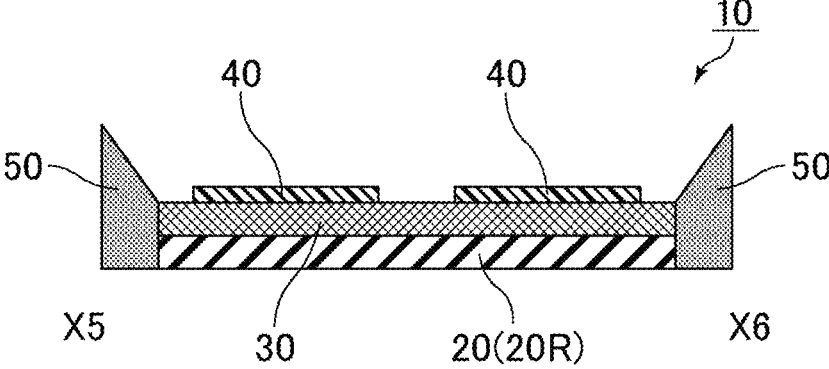
FIG. 4 is a schematic cross-sectional view of a micro-LED chip of a first example.
Figure 5:
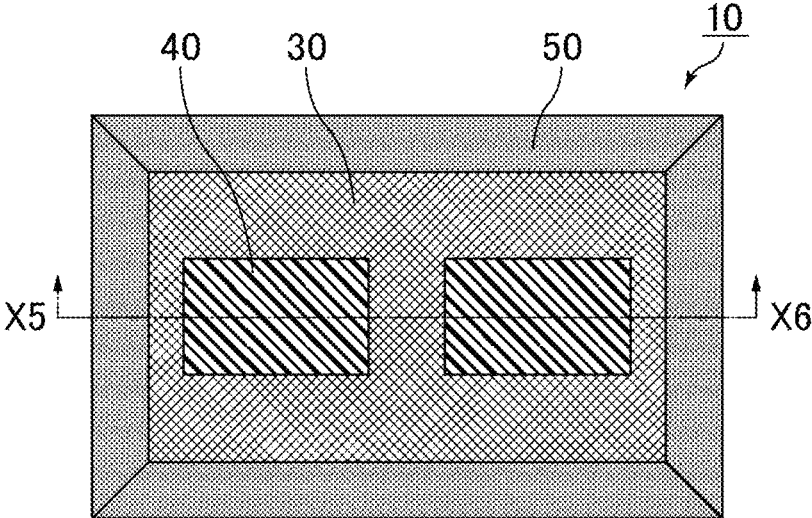
FIG. 5 is a schematic plan view of the micro-LED chip shown in FIG. 4.

FIG. 4 is a schematic cross-sectional view of a micro-LED chip of a first example. FIG. 5 is a schematic plan view of the micro-LED chip shown in FIG. 4. FIG. 4 corresponds to a schematic cross-sectional view taken along X1-X2 line in FIG. 5. As shown in FIG. 4 and FIG. 5, each micro-LED chip 10 includes a micro-LED 30, first contact electrodes 40 electrically connected to the micro-LED 30, and a light blocking component 50 surrounding the micro-LED 30.

The micro-LED chip 10 may further include a wavelength conversion layer 20, and may include, as shown in FIG. 4 and FIG. 5, the wavelength conversion layer 20, the micro-LED 30, and the first contact electrodes 40 in the stated order. The micro-LED chip 10 shown in FIG. 4 and FIG. 5 is mounted on the array substrate with the wavelength conversion layer 20 being on the viewer side relative to the micro-LED 30. Light emitted from the micro-LED 30 is transmitted through the wavelength conversion layer 20 and then emitted to the viewer side, so that the desired display can be provided.

The light blocking component 50 surrounds the micro-LED 30. The light blocking component 50 surrounding the micro-LED can prevent color mixture between adjacent pixels. The light blocking component 50, in a plan view, is placed at least between wavelength conversion layers 20 of different emission colors, and may surround a corresponding wavelength conversion layer 20 in a plan view as shown in FIG. 4 to FIG. 7.

Figure 6:
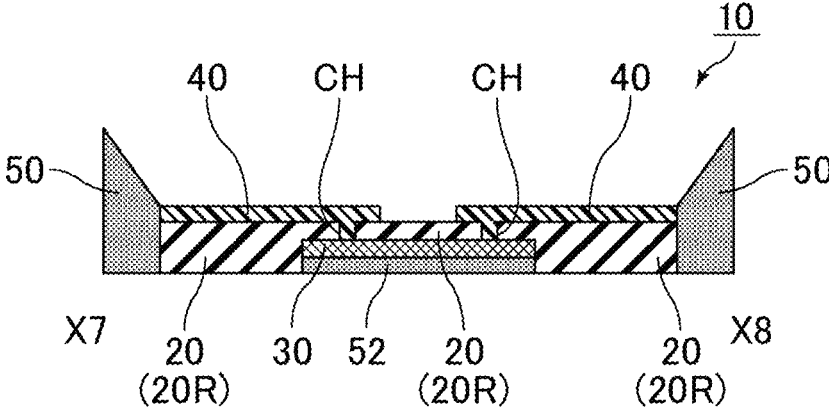
FIG. 6 is a schematic cross-sectional view of a micro-LED chip a second example.
Figure 7:
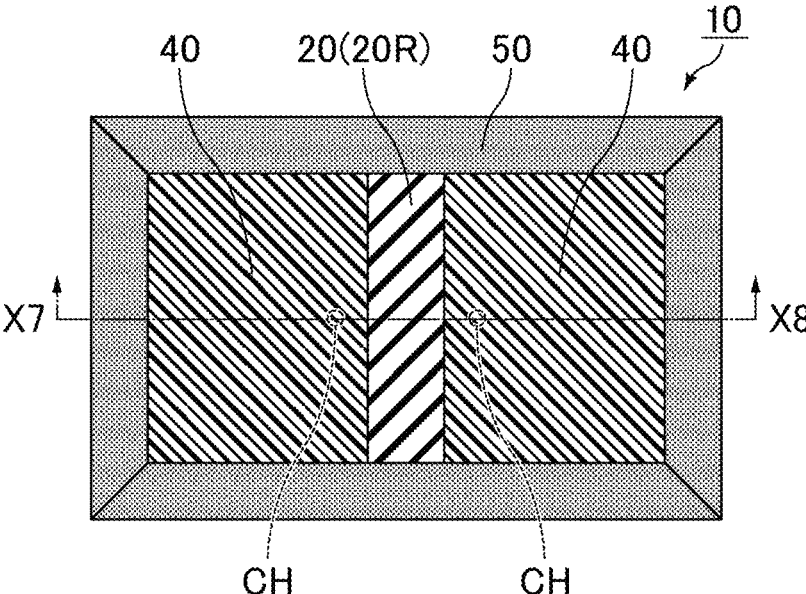
FIG. 7 is a schematic plan view of the micro-LED chip shown in FIG. 6.

FIG. 6 is a schematic cross-sectional view of a micro-LED chip of a second example. FIG. 7 is a schematic plan view of the micro-LED chip shown in FIG. 6. The micro-LED chip 10 may include the micro-LED 30, the wavelength conversion layer 20, and the first contact electrodes 40 in the stated order. In the micro-LED chip 10 shown in FIG. 6 and FIG. 7, light emitted from the micro-LED 30 is transmitted through the wavelength conversion layer 20, reflected by one of the first contact electrodes 40, and then emitted to the viewer side, so that the desired display is provided. The micro-LED chip 10 shown in FIG. 6 and FIG. 7 preferably includes a light blocking component 52 on the surface of the micro-LED 30 opposite to the first contact electrodes 40 in order to reduce color mixture. The light blocking component 52 can be the same component as the light blocking component 50.

(Producing Micro-LED Chips)

Figure 8:
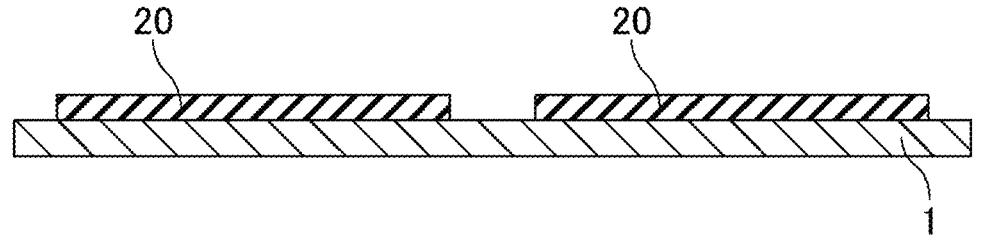
FIG. 8 is a schematic cross-sectional view showing forming wavelength conversion layers on a substrate included in producing micro-LED chips.

The following describes a method of producing the micro-LED chip shown in FIG. 4 and FIG. 5 is described. FIG. 8 is a schematic cross-sectional view showing forming wavelength conversion layers on a substrate included in producing micro-LED chips.

As shown in FIG. 8, first, the wavelength conversion layers 20 are formed on a substrate 1 such as a sapphire substrate. The wavelength conversion layers 20 may be formed in one-to-one correspondence with pixels. The method of forming the wavelength conversion layers 20 is not limited and can be a known method such as patterning by photolithography using a positive or negative resist material or patterning by a printing technique such as inkjet printing or screen printing. The material of the wavelength conversion layers 20 may be one usually used in the field of micro-LEDs.

The wavelength conversion layers 20 may include a red wavelength conversion layer 20R, a green wavelength conversion layer 20G, and a blue wavelength conversion layer 20B. The red wavelength conversion layer 20R may contain a red phosphor which emits light (red light) in the red spectrum (about 600 nm to about 780 nm) as fluorescence when excited by light emitted from the micro-LED 30. The green wavelength conversion layer 20G may contain a green phosphor which emits light (green light) in the green spectrum (about 500 nm to about 570 nm) as fluorescence when excited by light emitted from the micro-LED 30. The blue wavelength conversion layer 20B may contain a blue phosphor which emits light (blue light) in the blue spectrum (about 380 nm to about 500 nm) as fluorescence when excited by light emitted from the micro-LED 30.

The micro-LEDs 30 may emit white light, blue light (e.g., about 380 nm to about 500 nm), UV rays, or other light in response to voltage application. When the micro-LEDs 30 are each a micro-LED that emits white light, the red micro-LED chips 10R may each include the red wavelength conversion layer 20R as the wavelength conversion layer 20, the green micro-LED chips 10G may each include the green wavelength conversion layer 20G as the wavelength conversion layer 20, and the blue micro-LED chips 10B may each include the blue wavelength conversion layer 20B as the wavelength conversion layer 20.

When the micro-LEDs 30 are each a micro-LED that emits blue light, the red micro-LED chips 10R may each include the red wavelength conversion layer 20R as the wavelength conversion layer 20, and the green micro-LED chip 10G may each include the green wavelength conversion layer 20G as the wavelength conversion layer 20. The blue micro-LED chips 10B may each include a transparent layer containing no phosphor (phosphor absent layer) instead of the wavelength conversion layer 20, and blue light emitted from the micro-LED 30 may be transmitted through the phosphor absent layer without wavelength conversion before being emitted.

Figure 9:
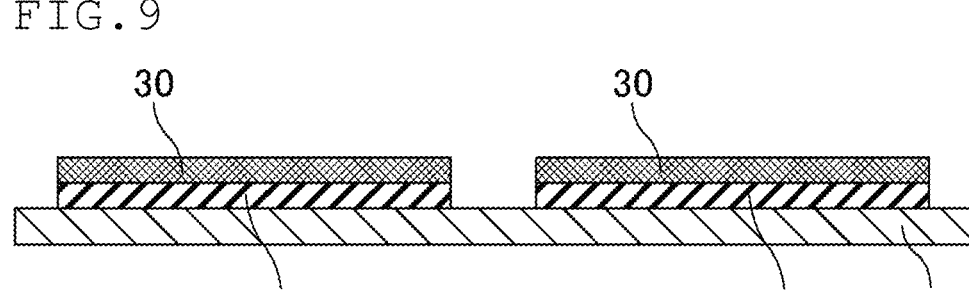
FIG. 9 is a schematic cross-sectional view showing forming micro-LEDs included in the producing of micro-LED chips.

FIG. 9 is a schematic cross-sectional view showing forming micro-LEDs included in the producing of micro-LED chips. As shown in FIG. 9, the micro-LEDs 30 are formed on the wavelength conversion layers 20 of the respective colors formed above in one-to-one correspondence with pixels. The method of forming the micro-LEDs 30 is not limited and can be a known method.

Each micro-LED 30 may have any structure such as a structure including, for example, an anode, a p-type semiconductor layer, a light emitting layer (active layer), an n-type semiconductor layer, and a cathode. The micro-LED 30 is preferably an inorganic light emitting diode and preferably includes a nitride semiconductor layer such as a GaN semiconductor layer. Including a nitride semiconductor layer, the micro-LED 30 can be a micro light emitting element capable of emitting light in the UV to red spectra.

Figure 10:
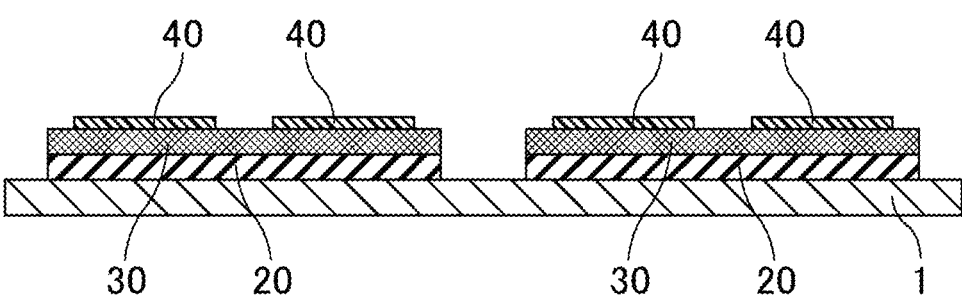
FIG. 10 is a schematic cross-sectional view showing forming first contact electrodes included in the producing of micro-LED chips.

FIG. 10 is a schematic cross-sectional view showing forming first contact electrodes included in the producing of micro-LED chips. One micro-LED chip may include multiple first contact electrodes 40. Each micro-LED chip 10 may include, for example, two first contact electrodes 40, one being electrically connected to the anode of the micro-LED 30 and the other being electrically connected to the cathode of the micro-LED 30.

The material of the first contact electrodes 40 may be a metal material such as aluminum, titanium, molybdenum, tantalum, or tungsten.

The method of forming the first contact electrodes 40 may be any method such as a method including, for example, forming a metal film on the micro-LEDs 30, placing a resist thereon, etching the metal film into the desired shape, and removing the resist.

After the first contact electrodes 40 are formed, as shown in FIG. 4, the light blocking components 50 are placed to surround the corresponding micro-LEDs 30. The method of forming the light blocking components 50 may be, for example, a method (photolithography) including applying a photosensitive resin composition for light blocking components 50, exposing the photosensitive resin composition to light, and developing the photosensitive resin composition.

Figure 11:
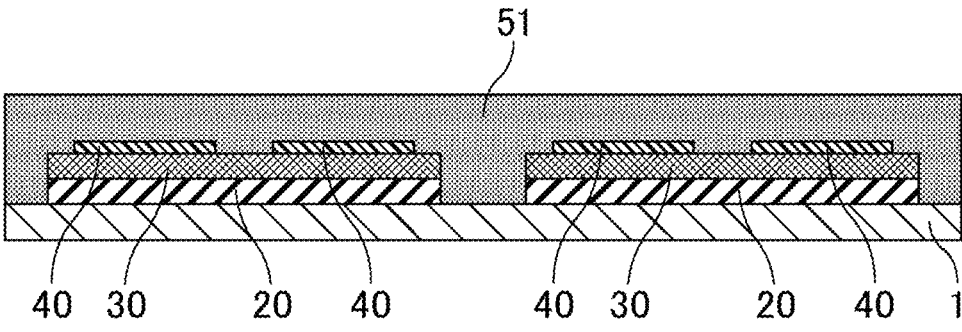
FIG. 11 is a schematic cross-sectional view showing applying a photosensitive resin composition in the producing of micro-LED chips.

FIG. 11 is a schematic cross-sectional view showing applying a photosensitive resin composition in the producing of micro-LED chips. As shown in FIG. 11, the photosensitive resin composition is applied to the first contact electrodes 40. The photosensitive resin composition may be applied to cover the top surfaces of the first contact electrodes 40, the micro-LEDs 30, the wavelength conversion layers 20, and the substrate 1 and the side surfaces of the first contact electrodes 40, the micro-LEDs 30, and the wavelength conversion layers 20.

Examples of the photosensitive resin composition include one obtained by adding a black colorant such as carbon black to a photosensitive resin. The photosensitive resin composition can be applied by a known method using a slit coater or a spin coater, for example. The application of a photosensitive resin composition may be followed by drying and other processes.

The photosensitive resin may be a positive photosensitive resin or a negative photosensitive resin, and can be a known resin. The positive photosensitive resin is a resin material that forms a coating whose parts exposed to UV rays or other light become soluble in the developer to be removed in the developing process. The negative photosensitive resin is a resin material that forms a coating whose parts exposed to UV rays or other light become insoluble in the developer to remain to form a pattern. To reduce or prevent deterioration of the wavelength conversion layers and the micro-LEDs due to irradiation with UV rays, a negative photosensitive resin with which UV rays are not applied to the display region is preferably used.

The light blocking components 50 each include a bump with an inclined surface. The inclined surface of the bump is at an angle to the horizontal direction of the later-described array substrate. The shape of the bump of the light blocking component 50 is not limited and may be, for example, a shape with the thickness of the light blocking component 50 decreasing from the outer periphery toward the inside of the micro-LED chip (the boundary between the light blocking component 50 and the micro-LED) as shown in FIG. 4. The light blocking component 50, in a plan view, preferably does not overlap the corresponding micro-LED 30.

Figure 12:
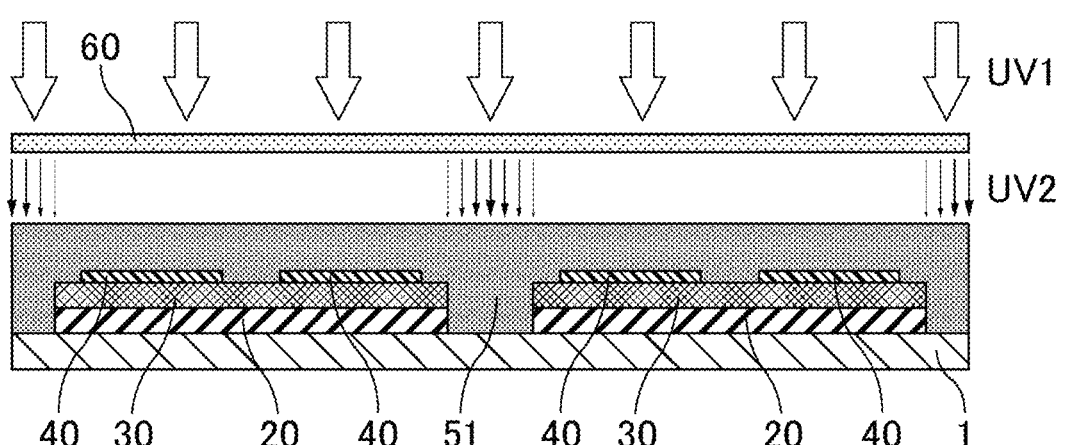
FIG. 12 is a schematic cross-sectional view showing overlaying a half-tone mask on a photosensitive resin composition and exposing the photosensitive resin composition to light through the half-tone mask, included in the producing of micro-LED chips.

FIG. 12 is a schematic cross-sectional view showing overlaying a half-tone mask on a photosensitive resin composition and exposing the photosensitive resin composition to light through the half-tone mask, included in the producing of micro-LED chips. The producing of micro-LED chips preferably includes producing the light blocking components including the inclined surface by overlaying a half-tone mask on the photosensitive resin composition and exposing the photosensitive resin composition to light through the half-tone mask. The half-tone mask is a mask whose transmittance changes in stages. Using a mask whose transmittance changes in stages, bumps with an inclined surface can be formed on the light blocking components.

When a positive photosensitive resin is used, a half-tone mask can be used whose transmittance is low for regions in which the light blocking component is intended to be thick and whose transmittance is high for regions in which the light blocking component is intended to be thin. When a negative photosensitive resin is used, as shown in FIG. 12, a half-tone mask can be used whose transmittance is high for regions in which the light blocking component is intended to be thick and whose transmittance is low for regions in which the light blocking component is intended to be thin.

The following describes a method of forming the light blocking components 50 each of which surrounds the corresponding wavelength conversion layer 20 and includes a bump having a shape with the thickness of the light blocking component 50 decreasing from the outer periphery toward the inside of the micro-LED chip as shown in FIG. 4 to FIG. 7. The following description shows a case of using a negative photosensitive resin.

Figure 13:
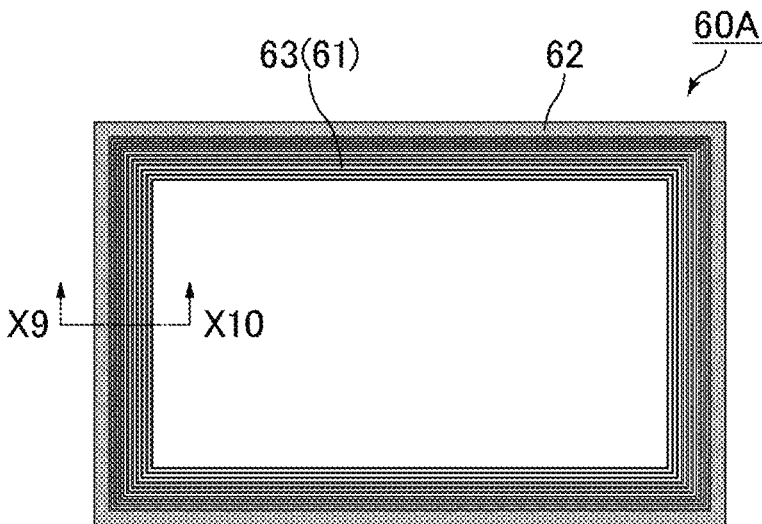
FIG. 13 is a schematic plan view of a half-tone mask of a first example.
Figure 14:
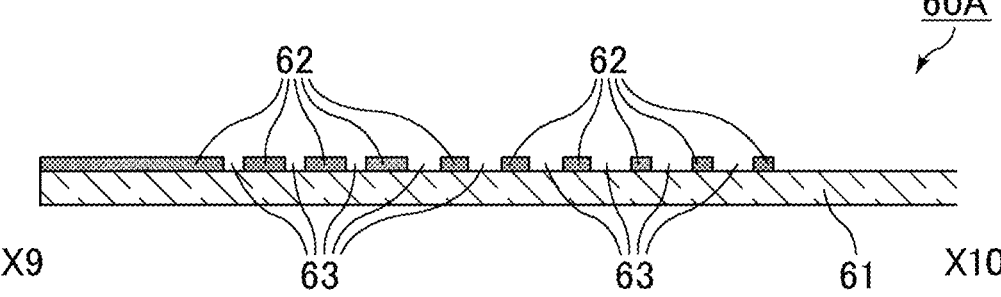
FIG. 14 is a schematic cross-sectional view taken along X9-X10 line for the half-tone mask shown in FIG. 13.

FIG. 13 is a schematic plan view of a half-tone mask of a first example. FIG. 14 is a schematic cross-sectional view taken along X9-X10 line for the half-tone mask shown in FIG. 13. FIG. 13 is a plan view of a half-tone mask for one micro-LED chip shown in FIG. 4. As shown in FIG. 13 and FIG. 14, a half-tone mask 60A includes light blockers 62 and slits 63 each formed between the light blockers 62. The light blockers 62 preferably include light blockers 62 with different widths. The light blockers 62 may be formed on the surface of a transparent substrate 61.

Non-limiting examples of the transparent substrate 61 include glass substrates, acrylic substrates, polycarbonate substrates, and polyethylene terephthalate substrates.

Examples of the light blockers 62 include evaporated light blocking metal films such as evaporated chromium, aluminum, or silver films.

The exposure to light includes applying light having a wavelength suitable for the photosensitive resin used to form the light blocking components 50, and may include, for example, applying light including UV rays (wavelength of 100 nm to 400 nm).

In FIG. 13 and FIG. 14, the light blockers 62 are not arranged in the central portion of the half-tone mask 60A (in FIG. 5, the portion overlapping the micro-LED 30), and are arranged such that the width of the light blockers 62 increases from the inside of the micro-LED chip (the boundary between the light blocking component 50 and the micro-LED) toward the outer periphery of the micro-LED chip. In this case, the width of the slits 63 decreases from the inside toward the outside of the half-tone mask 60A.

Figure 15:
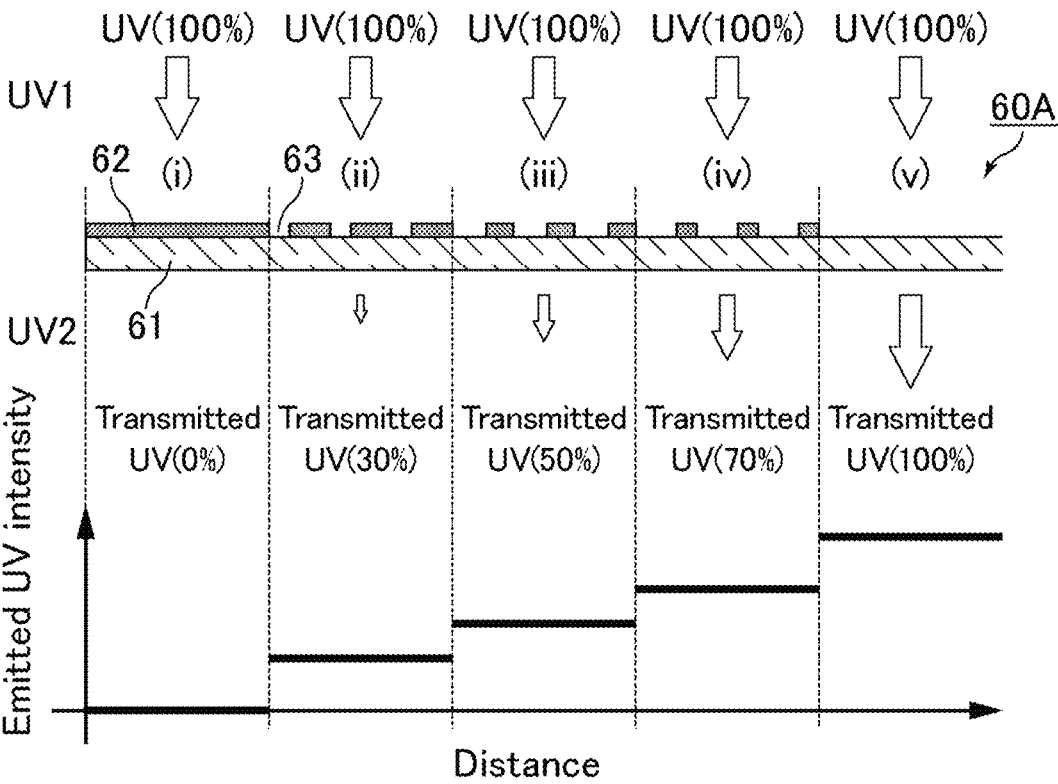
FIG. 15 is a schematic cross-sectional view showing values of transmittance of the half-tone mask shown in FIG. 13 and FIG. 14.

FIG. 15 is a schematic cross-sectional view showing values of transmittance of the half-tone mask shown in FIG. 13 and FIG. 14.

A case is shown where the transmittance of the half-tone mask is divided into regions (i) to (v) from the outer periphery toward the inside of a micro-LED chip. When light emitted to the half-tone mask 60A (emitted light) is UV1 and the transmittance for the light transmitted through the half-tone mask 60A (transmitted light) is UV2, the transmittance UV2 of the region (i) with only the light blocker 62 without any slit is 0% and the transmittance UV2 of the region (v) with no light blocker 62 is 100%, each relative to 100% of the emitted light. The width of the light blocker 62 may be adjusted for each region to increase the transmittance UV2 in stages from the region (i) toward the region (v), for example, to make the transmittance UV2 in the region (ii) 30%, the UV1 transmittance in the region (iii) 50%, and the transmittance UV2 in the region (iv) 70%.

Figure 16:
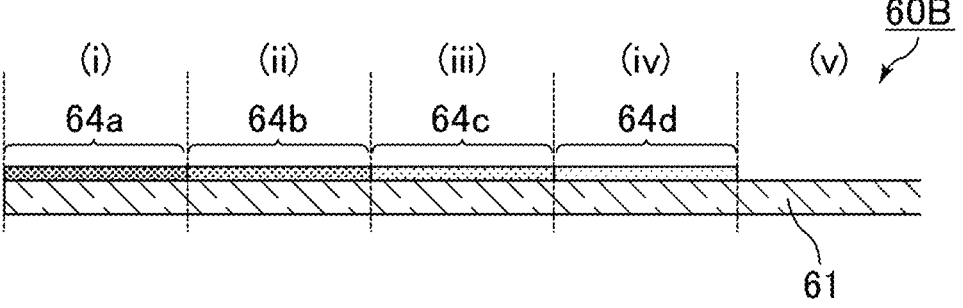
FIG. 16 is a schematic cross-sectional view of part of a half-tone mask of a second example.
Figure 17:
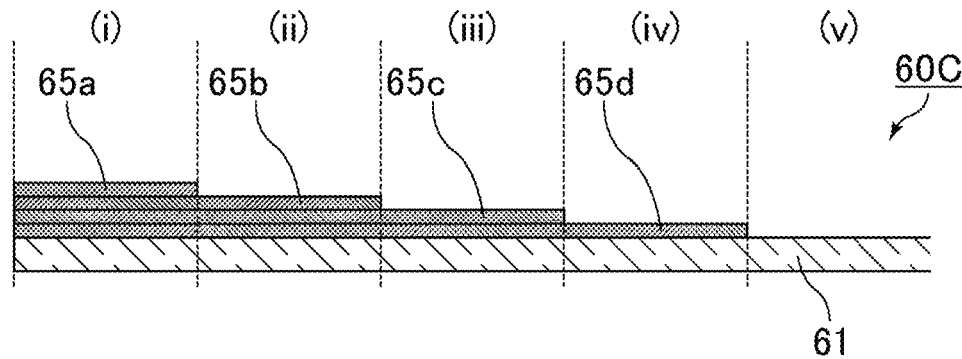
FIG. 17 is a schematic cross-sectional view of part of a half-tone mask of a third example.

The half-tone mask may be any mask whose transmittance changes in stages, and is not limited to the mask shown in FIG. 13 and FIG. 14. FIG. 16 is a schematic cross-sectional view of part of a half-tone mask of a second example. FIG. 17 is a schematic cross-sectional view of part of a half-tone mask of a third example.

As shown in FIG. 16, the half-tone mask may be a half-tone mask 60B including regions with different evaporated metal densities. The method of forming regions with different evaporated metal densities may be, for example, a method including lengthening the time for forming an evaporated metal film on the transparent substrate 61 or thickening the evaporated metal film from the region (iv) toward the region (i) without forming an evaporated metal film in the region (v).

Examples of the evaporated metal include light blocking metals such as chromium, aluminum, and silver.

As shown in FIG. 17, the half-tone mask may be a half-tone mask 60C including a stack of semi-transparent films. For example, the half-tone mask may be produced by a method including preparing semi-transparent films with a certain transmittance, and increasing the number of semi-transparent films stacked from the region (iv) toward the region (i) without placing any semi-transparent film in the region (v). Examples of the semi-transparent films include films obtained by scattering plastic beads made of an acrylic resin or another material on a film such as a polyethylene terephthalate (PET) film, and polarizing films obtained by adsorbing iodine compound molecules on a polyvinyl alcohol (PVA) film and aligning the molecules. When the semi-transparent films are polarizing films, stacking multiple polarizing films is not necessary, and the transmittance can be changed by adjusting the angles of polarization of individual polarizing films.

FIG. 15 to FIG. 17 show the cases where the light transmittance changes in separate stages of 0%, 30%, 50%, 70%, and 100%. Yet, the region across which the transmittance changes may be divided into smaller stages, or the width of the light blocking component, the density or thickness of the evaporated metal, the width across which the semi-transparent films are stacked, or the number of such semi-transparent films to be stacked, for example, may be adjusted such that the transmittance may changes gently.

When the bumps shown in FIG. 4 are formed using a negative photosensitive resin, the transmitted light transmittance UV2 in the region (v) with no light blocking component 50 is set to 0%, and the transmitted light transmittance UV2 in the region (i) where the light blocking component 50 is intended to be thickest is set to 100%. To increase the transmittance UV2 in stages from the region (v) toward the region (i), the width of the light blocking component, the density or thickness of the evaporated metal, the width across which the semi-transparent films are stacked, or the number of such semi-transparent films to be stacked, for example, may be adjusted.

Figure 18:
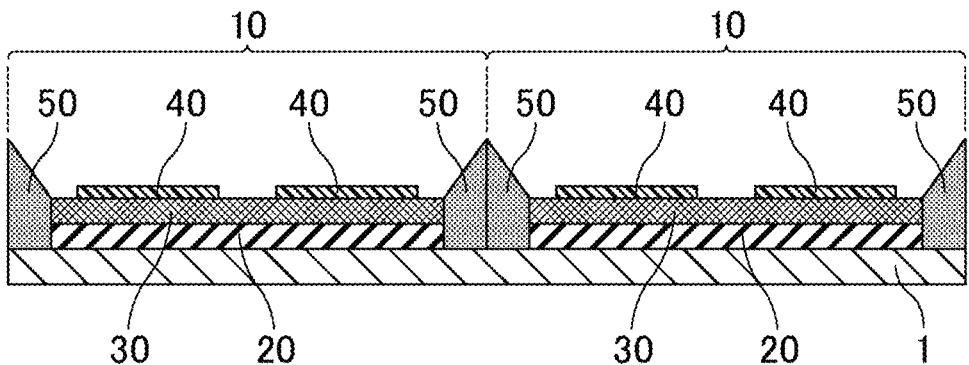
FIG. 18 is a schematic cross-sectional view of micro-LED chips in each of which a light blocking component is formed.

After the exposure to light shown in FIG. 12, the parts exposed to light in the developing are removed, so that the light blocking components 50 including a bump with an inclined surface are formed. FIG. 18 is a schematic cross-sectional view of micro-LED chips in each of which a light blocking component is formed. The method of the developing is not limited and can be a known method. The micro-LED chips 10 from which the photosensitive resin has been removed include the first contact electrodes 40 exposed.

Figure 19:
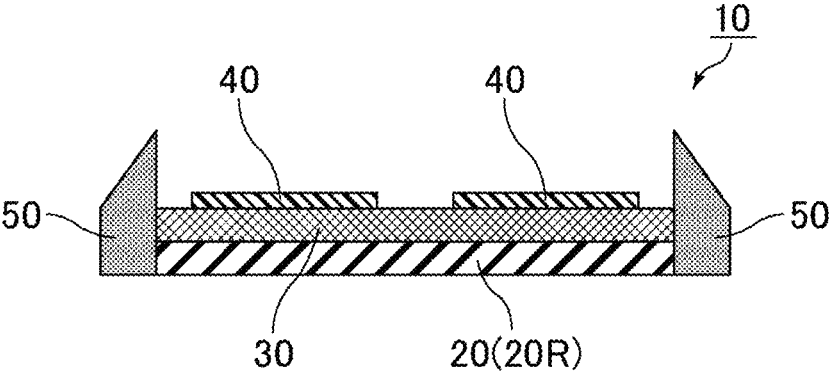
FIG. 19 is a schematic cross-sectional view of a micro-LED chip of a third example.
Figure 20:
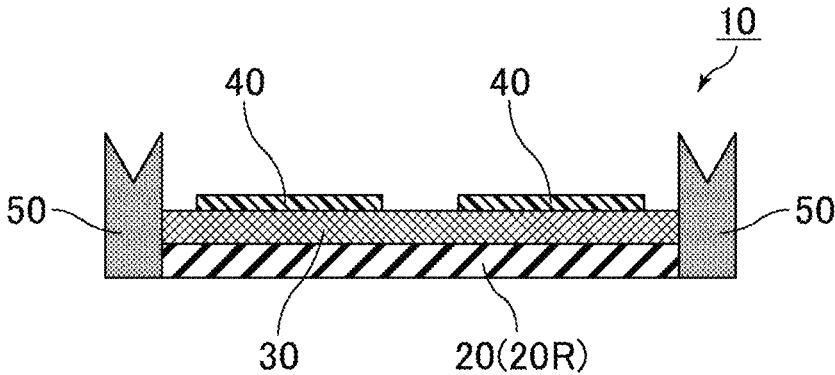
FIG. 20 is a schematic cross-sectional view of a micro-LED chip of a fourth example.

The bumps with an inclined surface are not limited to the bumps shown in FIG. 4 and can be made into any shape by adjusting the transmittance of the half-tone mask used in exposure to light. FIG. 19 is a schematic cross-sectional view of a micro-LED chip of a third example. FIG. 20 is a schematic cross-sectional view of a micro-LED chip of a fourth example. The shape of the bump with an inclined surface of each light blocking component 50 may be, for example, as shown in FIG. 19, a shape with the thickness of the light blocking component 50 decreasing from the boundary between the light blocking component 50 and the micro-LED toward the outer periphery of the micro-LED chip. Also, as shown in FIG. 20, a V-shaped notch may be formed in the bump with an inclined surface such that the thickness of the light blocking component 50 decreases from both the outer periphery of the micro-LED chip and the boundary between the light blocking component 50 and the micro-LED toward the center in the width direction of the light blocking component 50. Although not shown, the bump with an inclined surface may be formed such that, conversely to the structure in FIG. 20, the thickness of the light blocking component 50 increases from both the outer periphery of the micro-LED chip and the boundary between the light blocking component 50 and the micro-LED toward the center in the width direction of the light blocking component 50.

When the micro-LED chip of the second example shown in FIG. 6 and FIG. 7 is produced which includes the micro-LED 30, the wavelength conversion layer 20, and the first contact electrodes 40 in the stated order, for example, the micro-LEDs 30 are formed on a substrate such as a sapphire substrate, followed by forming the wavelength conversion layers 20. Contact holes CH may be formed in each wavelength conversion layer 20 to electrically connect the conductive lines and the like of the micro-LED 30 to the first contact electrodes 40 placed on the wavelength conversion layer 20 through the contact holes CH. Thereafter, in a plan view, the light blocking component may be placed to surround the micro-LED.

(Producing Array Substrate)

Figure 21:
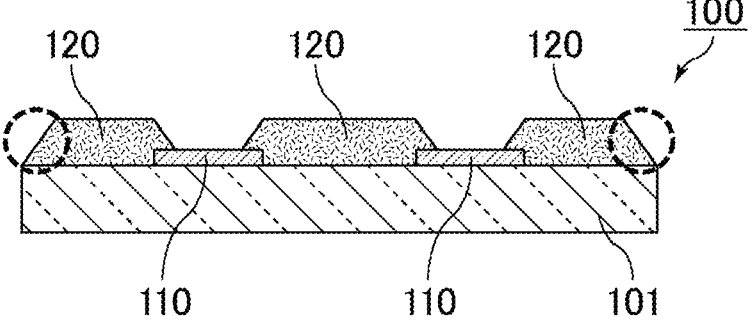
FIG. 21 is a schematic cross-sectional view of an array substrate of a first example.

FIG. 21 is a schematic cross-sectional view of an array substrate of a first example. FIG. 21 is also a schematic cross-sectional view of one pixel of the array substrate corresponding to one micro-LED chip. The array substrate 100 includes switching elements (not shown), second contact electrodes 110 electrically connected to the switching elements, and an insulating film 120 formed on the second contact electrodes 110 with part of each second contact electrode 110 being exposed.

The array substrate 100 of the first example shown in FIG. 21 is an array substrate on which the micro-LED chips of the first example shown in FIG. 4 are to be mounted. In the array substrate 100 of the first example shown in FIG. 21, the insulating film 120 is provided with dents corresponding to the bumps of the light blocking components 50 of the micro-LED chips 10 of the first example. In FIG. 21, the dents of the insulating film 120 are surrounded by the dotted lines. The shape of the insulating film 120 between two second contact electrodes 110 is not limited.

An example of the producing of an array substrate is described. First, a circuit board 101 is prepared which includes, on a supporting substrate, switching elements such as thin film transistors (TFTs) and conductive lines connected to the switching elements.

Here, the micro-LED panel may be driven by the passive matrix method or the active matrix method. The following describes the active matrix method. In the case of the active matrix method, the circuit board 101 may include, for example, gate lines, source lines crossing the gate lines, and pixel circuits at the respective intersections of these lines, and one pixel circuit may constitute one pixel. In the placing of the micro-LED chips described below, one micro-LED 30 may be placed in one pixel circuit. In the frame region, a gate driver that scan-drives the gate lines, and a source driver that supplies video signals corresponding to the luminance information to the source lines, for example, may be placed.

Figure 22:
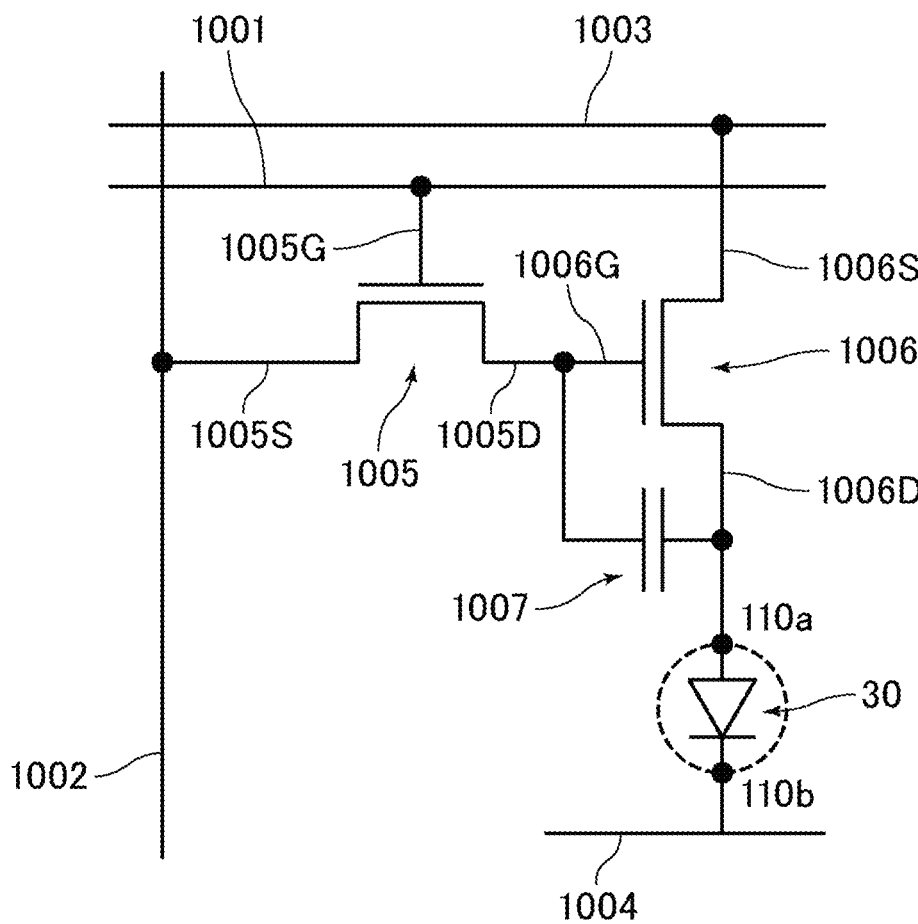
FIG. 22 is a circuit diagram showing an example of a configuration of a pixel circuit included in a circuit board.

FIG. 22 is a circuit diagram showing an example of a configuration of a pixel circuit included in a circuit board. The configuration of the pixel circuit is not limited to the configuration shown in FIG. 22. The pixel circuit of the circuit board 101 may include, for example, a switching transistor 1005, a drive transistor 1006, and a storage capacitor 1007. The micro-LED 30 surrounded by the dotted line in FIG. 22 corresponds to a micro-LED 30 shown in FIGS. 2 and 3, for example, and is to be mounted in the placing of micro-LED chips described later. For description, the micro-LED 30 is also depicted in the pixel circuit, but the part excluding the micro-LED 30 is produced in the producing of an array substrate.

As shown in FIG. 22, for example, a gate electrode 1005G, a source electrode 1005S, and a drain electrode 1005D of the switching transistor 1005 may respectively be connected to a gate line 1001, a source line 1002, and a gate electrode 1006G of the drive transistor 1006. The gate electrode 1006G and a source electrode 1006S of the drive transistor 1006 may respectively be connected to the drain electrode 1005D of the switching transistor 1005 and the anode power line 1003. A storage capacitor 1007 may be connected between the gate electrode 1006G and a drain electrode 1006D of the drive transistor 1006. In other words, the storage capacitor 1007 may be connected to the drain electrode 1005D of the switching transistor 1005.

Figure 23:
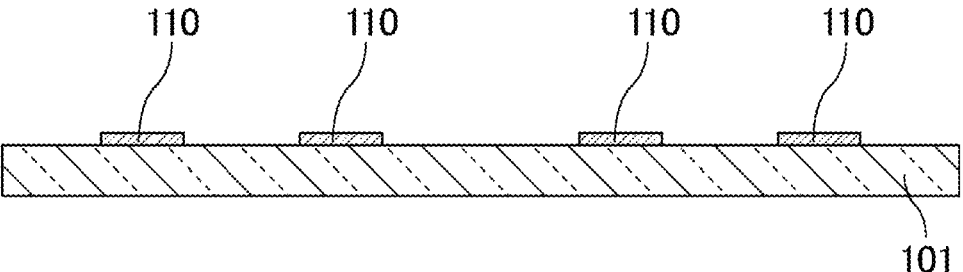
FIG. 23 is a schematic cross-sectional view showing forming second contact electrodes included in producing an array substrate.

FIG. 23 is a schematic cross-sectional view showing forming second contact electrodes included in producing an array substrate. As shown in FIG. 23, the second contact electrodes 110 are formed on the circuit board 101. Multiple second contact electrodes 110 may be placed per pixel in which one micro-LED chip 10 is placed. For example, the second contact electrodes 110 may each include a second contact electrode 110a electrically connected to the drain electrode 1006D of the drive transistor 1006 shown in FIG. 22 and a second contact electrode 110b electrically connected to a cathode power line 1004.

Examples of the material of the second contact electrodes 110 include metals such as aluminum, titanium, molybdenum, tantalum, and tungsten.

The method of forming the second contact electrodes 110 is not limited and may be, for example, a method including forming a metal film on the circuit board 101, placing a resist, etching the metal film into the desired shape, and removing the resist.

Figure 24:
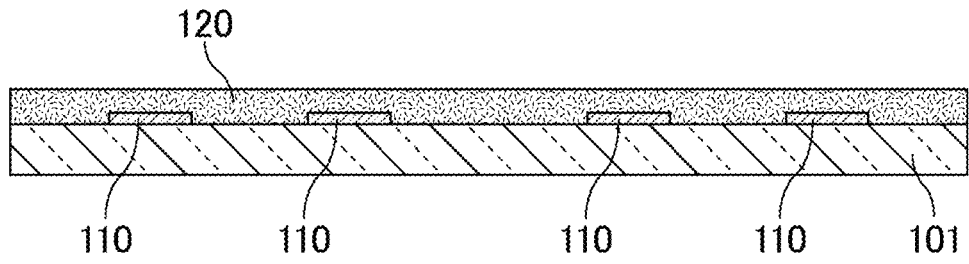
FIG. 24 is a schematic cross-sectional view showing forming an insulating film on the second contact electrodes in the producing of an array substrate.

FIG. 24 is a schematic cross-sectional view showing forming an insulating film on the second contact electrodes in the producing of an array substrate. First, as shown in FIG. 24, an insulating film 120 may be formed on the second contact electrodes 110 to cover the top surfaces of the second contact electrodes and the circuit board 101 and the side surface of the second contact electrodes.

Examples of the material of the insulating film 120 include $SiO_2$, SiN, SiON, and SiCO. The method of forming the insulating film 120 may be, for example, a method such as the chemical vapor deposition (CVD) method or the physical vapor deposition (PVD) method. Another method of forming the insulating film 120 may be a formation method by UV irradiation using a photosensitive resin.

Figure 25:
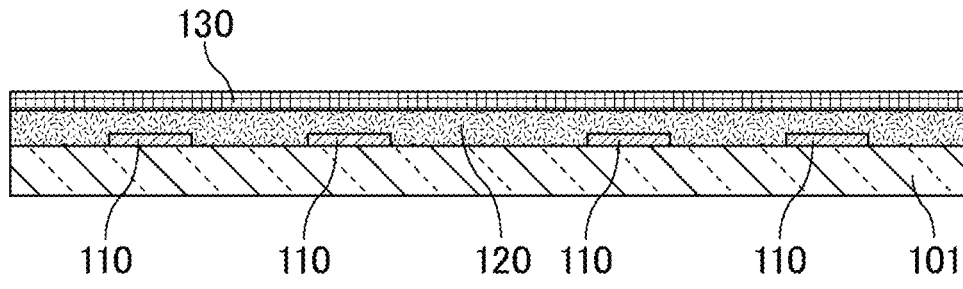
FIG. 25 is a schematic cross-sectional view showing applying a resist to the insulating film in the producing of an array substrate.

FIG. 25 is a schematic cross-sectional view showing applying a resist to the insulating film in the producing of an array substrate. As shown in FIG. 25, a resist 130 is formed on the insulating film 120. The resist 130 is not limited and can be one known in the field of micro-LED panels. The resist 130 may be a positive or negative resist. A case of using a negative resist is described below, for example. The method of forming the resist 130 may be a method of applying a resist using a slit coater or a spin coater.

Figure 26:
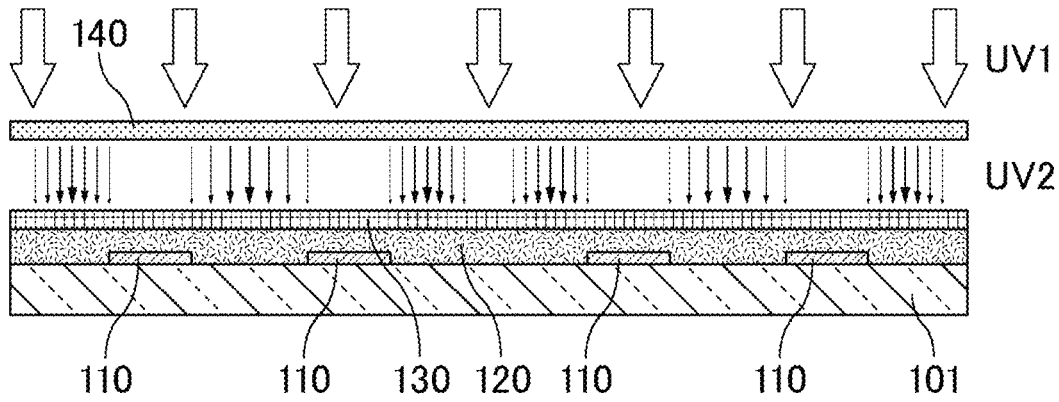
FIG. 26 is a schematic cross-sectional view showing exposing the resist to light in the producing of an array substrate.

FIG. 26 is a schematic cross-sectional view showing exposing the resist to light in the producing of an array substrate. As shown in FIG. 26, the resist 130 may be irradiated with light (exposed to light) through a half-tone mask. At this time, to expose to light the resist 130 on parts of the insulating film 120 to which the bumps of the light blocking components of the micro-LED chips are to be opposite after the mounting, a half-tone mask whose transmittance has been adjusted is preferably used. Since the shape of the insulating film 120 around the second contact electrodes 110 is not limited as long as the second contact electrodes 110 are exposed, a half-tone mask may not be used.

Figure 27:
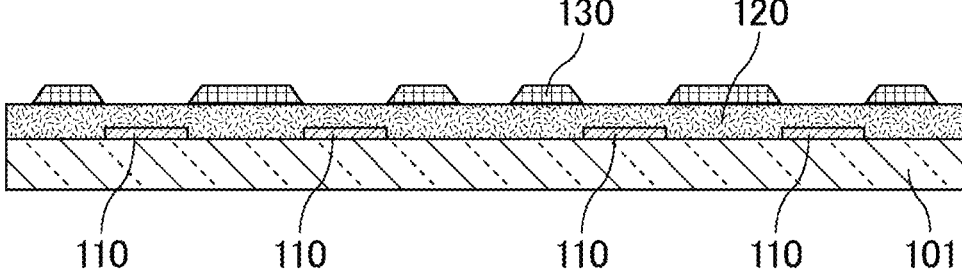
FIG. 27 is a schematic cross-sectional view showing developing the resist exposed to light in the producing of an array substrate.

FIG. 27 is a schematic cross-sectional view showing developing the resist exposed to light in the producing of an array substrate. As shown in FIG. 27, the parts of the resist 130 exposed to light in the developing are removed for patterning of the resist 130. The developing method can be a known developing method.

Figure 28:
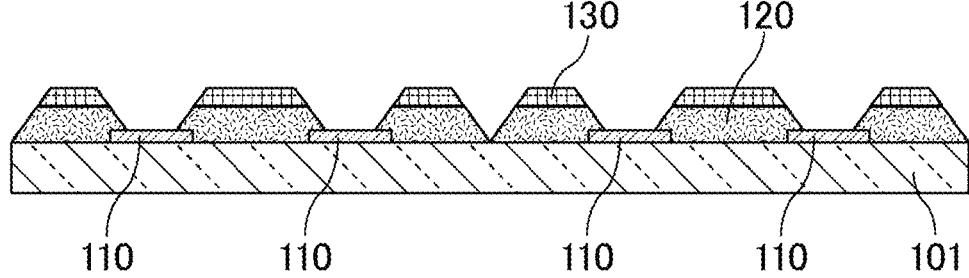
FIG. 28 is a schematic cross-sectional view showing etching the insulating film in the producing of an array substrate.

FIG. 28 is a schematic cross-sectional view showing etching the insulating film 120 in the producing of an array substrate. As shown in FIG. 28, the parts of the insulating film 120 on the second contact electrodes 110 are removed to leave the second contact electrodes 110 exposed. Also, the parts of the insulating film 120 to be opposite to the bumps of the light blocking components of the micro-LED chips are removed. The method of removing the insulating film 120 can be a known etching method.

Figure 29:
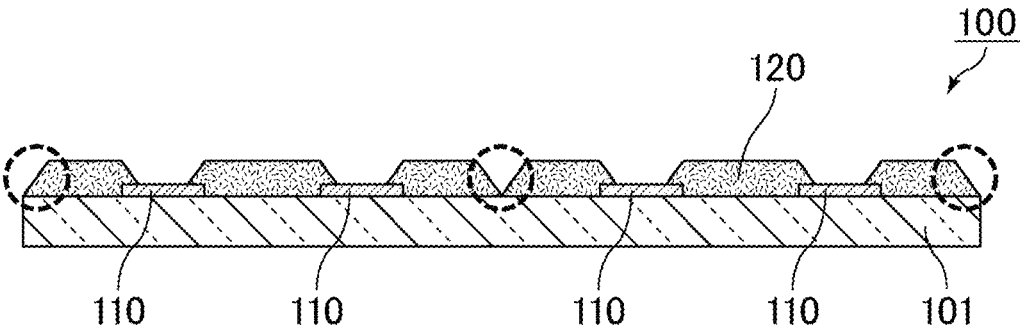
FIG. 29 is a schematic cross-sectional view of the array substrate from which the resist has been removed in the producing of an array substrate.

FIG. 29 is a schematic cross-sectional view of the array substrate from which the resist has been removed in the producing of an array substrate. In FIG. 29, two pixels of the array substrate corresponding to two micro-LED chips are shown. The remaining parts of the resist 130 are removed, so that the insulating film 120 patterned into the desired shape as shown in FIG. 29 can be obtained.

The insulating film 120 is formed on the second contact electrodes 110 with part of each second contact electrode 110 being exposed. The insulating film 120 is also provided with dents with an inclined surface. In FIG. 29, the dents of the insulating film 120 are surrounded by dotted lines. The insulating film 120 is provided with dents corresponding to the bumps of the light blocking components 50 of the micro-LED chips to be mounted on the array substrate. The dents with an inclined surface in the insulating film 120 preferably have a shape that forms a pair with the corresponding bumps of the light blocking component 50 such that when the bumps of the light blocking components 50 come to oppose the respective dents of the insulating film 120, the inclined surfaces are also opposite to each other and parallel to each other.

Figure 30:
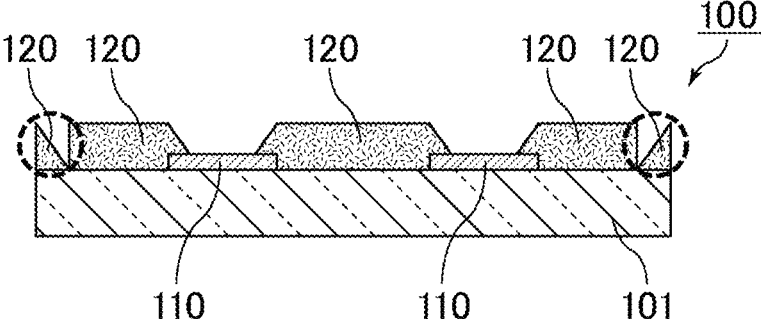
FIG. 30 is a schematic cross-sectional view of an array substrate of a second example.
Figure 31:
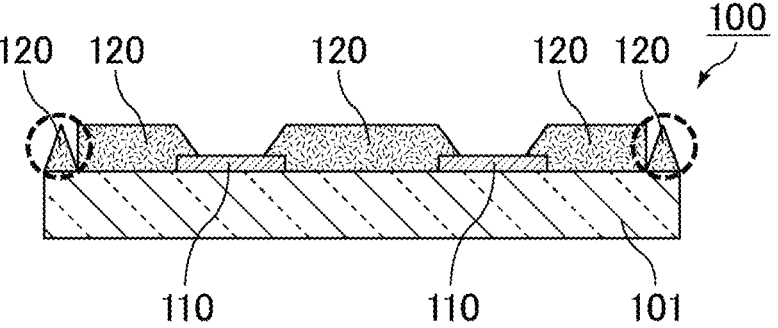
FIG. 31 is a schematic cross-sectional view of an array substrate of a third example.

The shape of the dents of the insulating film 120 can be formed into any shape by adjusting the transmittance of the half-tone mask used for the exposure to light. FIG. 30 is a schematic cross-sectional view of an array substrate of a second example. FIG. 31 is a schematic cross-sectional view of an array substrate of a third example. In FIG. 30 and FIG. 31, the dents of the insulating film 120 are surrounded by dotted lines. FIG. 30 shows an array substrate on which the micro-LED chips of the third example shown in FIG. 19 are to be mounted. FIG. 31 shows an array substrate on which the micro-LED chips of the fourth example shown in FIG. 20 are to be mounted. FIG. 30 and FIG. 31 are each a schematic cross-sectional view of one pixel of the array substrate corresponding to one micro-LED chip.

(Placing the Micro-LED Chips on Array Substrate)

Figure 32:
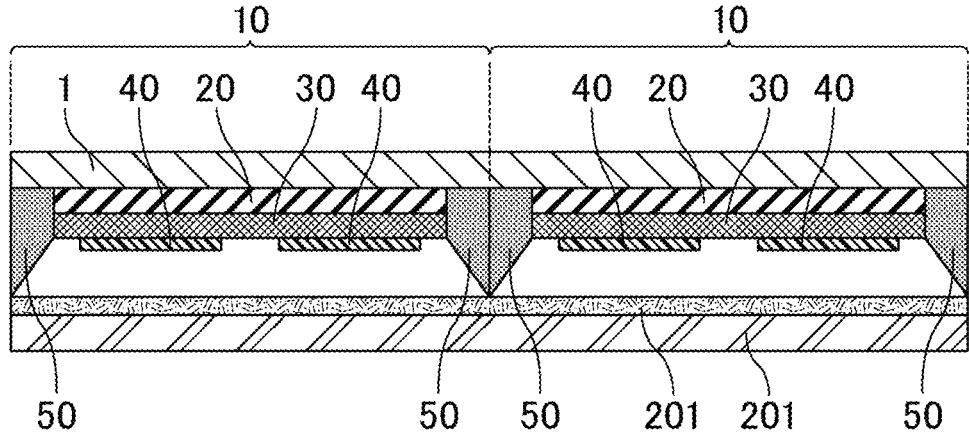
FIG. 32 is a schematic cross-sectional view showing transferring the micro-LED chips to an adhesive layer in mounting micro-LED chips.

FIG. 32 is a schematic cross-sectional view showing transferring the micro-LED chips to an adhesive layer in mounting micro-LED chips. In the placing of the micro-LED chips on the array substrate (hereinbelow, also referred to as mounting of the micro-LED chips), first, as shown in FIG. 32, the micro-LED chips 10 produced in the producing of micro-LED chips may be transferred to an adhesive layer 202 formed on a substrate 201 such as a glass substrate. The micro-LED chips 10 are transferred such that the first contact electrodes 40 thereof are opposite to the adhesive layer 202.

Figure 33:
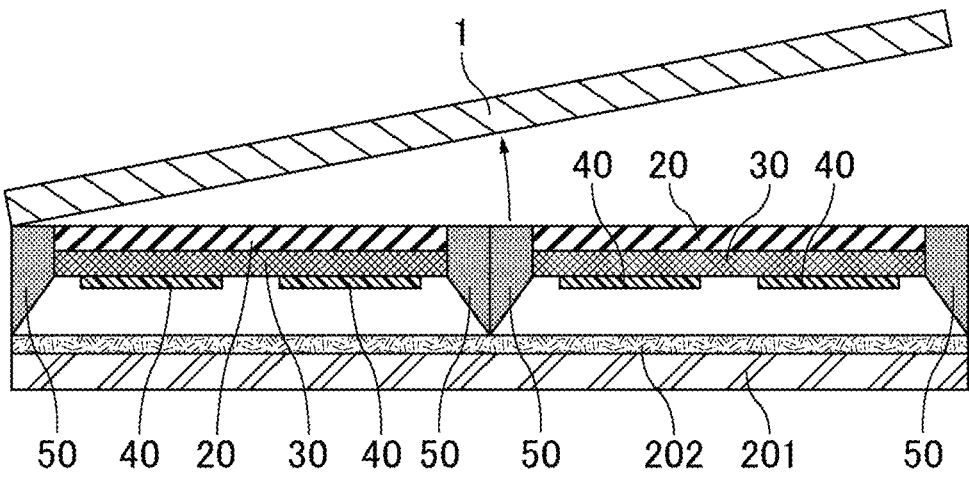
FIG. 33 is a schematic cross-sectional view showing removing the substrate in the mounting of micro-LED chips.
Figure 34:
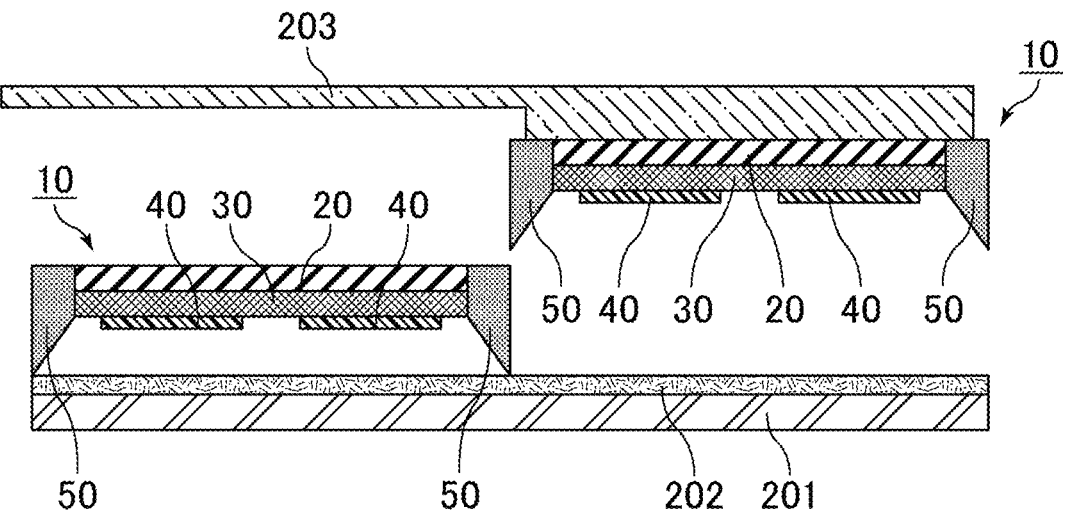
FIG. 34 is a schematic cross-sectional view showing picking up the micro-LED chips in the mounting of micro-LED chips.

FIG. 33 is a schematic cross-sectional view showing removing the substrate in the mounting of micro-LED chips. FIG. 34 is a schematic cross-sectional view showing picking up the micro-LED chips in the mounting of micro-LED chips. As shown in FIG. 33, the substrate 1 used in the producing of micro-LED chips is removed from the micro-LED chips. The substrate is removed, for example, by a method such as laser lift-off. Then, as shown in FIG. 34, the transfer head is used to pick up the micro-LED chips from the adhesive layer. The picking up method is not limited and can be a known method.

Figure 35:
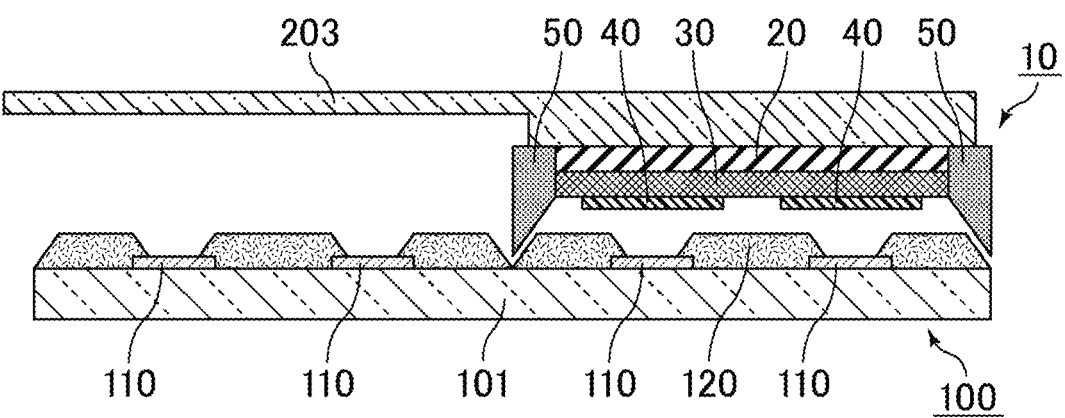
FIG. 35 is a schematic cross-sectional view showing placing the micro-LED chips on the array substrate in the mounting of micro-LED chips.

FIG. 35 is a schematic cross-sectional view showing placing the micro-LED chips on the array substrate in the mounting of micro-LED chips. One micro-LED chip 10 may be placed for one pixel circuit (one pixel) formed on the array substrate 100. In the mounting of the micro-LED chips, as shown in FIG. 35, the micro-LED chips are mounted with the bumps of the light blocking components 50 are opposite to the respective dents of the insulating film 120.

As described above, the bumps with an inclined surface are formed on the light blocking components 50 of the micro-LED chips 10 and the dents with an inclined surface are formed in the insulating film 120 of the array substrate 100. Preferably, the micro-LED chips 10 are placed with the inclined surfaces of the bumps of the light blocking components 50 are opposite to the respective inclined surfaces of the dents of the insulating film 120. More preferably, the micro-LED chips 10 are placed with the inclined surfaces of the bumps of the light blocking components 50 are parallel to the respective inclined surfaces of the dents of the insulating film 120. The thickness of the light blocking components 50 and the thickness of the insulating film 120 may be any thickness that allows formation of inclined surfaces.

Figure 36:
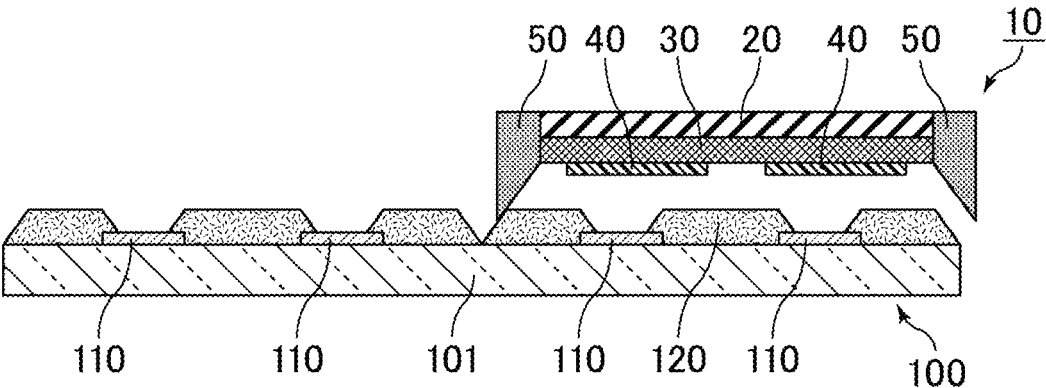
FIG. 36 is a schematic cross-sectional view showing a case where a micro-LED chip went off the position when the micro-LED chip was placed on the array substrate.
Figure 37:
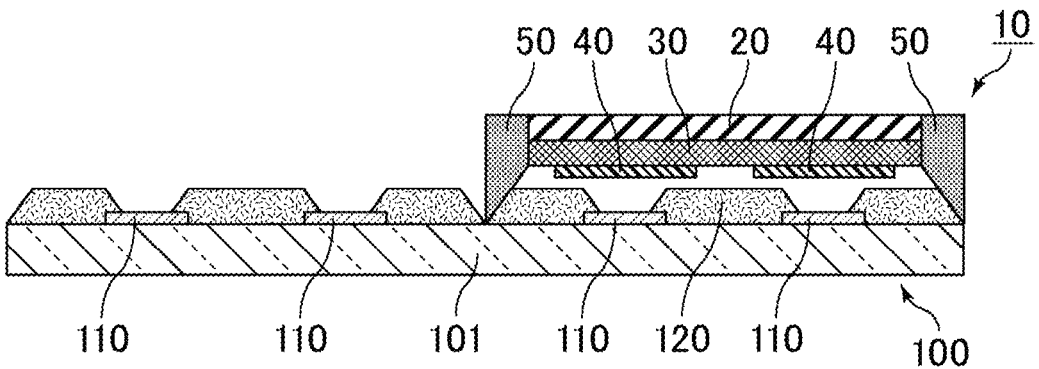
FIG. 37 is a schematic cross-sectional view showing a state where the misalignment shown in FIG. 36 has been corrected.

FIG. 36 is a schematic cross-sectional view showing a case where a micro-LED chip went off the position when the micro-LED chip was placed on the array substrate. FIG. 37 is a schematic cross-sectional view showing a state where the misalignment shown in FIG. 36 has been corrected. As the micro-LED chips 10 are minute and the number of the micro-LED chips 10 to be mounted is numerous, the micro-LED chips 10 go off the positions in some cases when the micro-LED chips are picked up and placed on the array substrate. Even when a micro-LED chip 10 went off the position as shown in FIG. 36, placing the micro-LED chips 10 with the bumps of the light blocking components 50 being opposite to the respective dents of the insulating film 120 causes the inclined surfaces of the bumps of the light blocking components 50 to come into contact with the inclined surfaces of the dents of the insulating film 120 so that the micro-LED chips 10 slide down the inclined surfaces of the dents of the insulating film 120. As a result, as shown in FIG. 37, the position of the micro-LED chip 10 is corrected to the proper position. Thus, in the subsequent electrically connecting the first contact electrodes and the second contact electrodes, misalignment of the micro-LED chips and bonding failure of the micro-LED chips can be reduced.

The method of producing a micro-LED panel according to the present embodiment includes forming bumps on the light-blocking components 50 for prevention of color mixture to impart the light blocking components 50 with the function of preventing misalignment in mounting the micro-LED chips. The method thus eliminates the need for placing additional components for preventing misalignment and can improve the yield and the display quality within the production lead time equivalent to that of the conventional production process.

Figure 38:
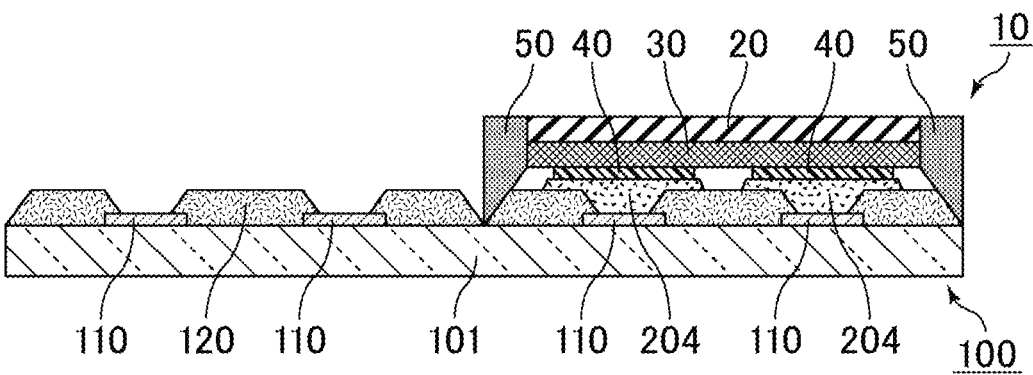
FIG. 38 is a schematic cross-sectional view showing electrically connecting the first contact electrodes of the micro-LED chips and the second contact electrodes of the array substrate in the mounting of micro-LED chips.

FIG. 38 is a schematic cross-sectional view showing electrically connecting the first contact electrodes of the micro-LED chips and the second contact electrodes of the array substrate in the mounting of micro-LED chips. The mounting of the micro-LED chips includes electrically connecting the first contact electrodes 40 of the micro-LED chips 10 and the second contact electrodes 110 of the array substrate 100. For example, as shown in FIG. 22 described above, the second contact electrode 110a may be electrically connected to the anode of the micro-LED 30 and the second contact electrode 110b may be electrically connected to the cathode of the micro-LED 30.

As shown in FIG. 38, the first contact electrodes 40 and the second contact electrodes 110 are preferably electrically connected to each other by a bonding material 204. Examples of the bonding material 204 include metal bonding materials, including solder and metal pastes such as silver pastes. The thickness of the bonding material 204 may be any thickness that allows the first contact electrodes 40 and the second contact electrodes 110 to be electrically connected to each other.

When the first contact electrodes 40 of the micro-LED chips 10 and the second contact electrodes 110 of the array substrate 100 are electrically connected to each other, the pixel circuits (see FIG. 22) of the micro-LED panel are completed, and thus the desired image display can be provided. The method of driving the micro-LED panel according to the embodiment is described with reference to FIG. 22. A grayscale signal indicating the emission intensity of the micro-LED 30 is supplied to the source line 1002. A gate signal controlling turning ON or OFF the switching transistor 1005 in which the grayscale signal is to be written is supplied to the gate line 1001. When the switching transistor 1005 is turned ON, the grayscale signal is accumulated in the storage capacitor 1007. Then, when the drive transistor 1006 is turned ON, a drive current corresponding to the grayscale signal flows to the drive transistor 1006. When the drive current output from the drive transistor 1006 is input to the micro-LED 30, the micro-LED 30 emits light with the emission intensity corresponding to the grayscale signal.

REFERENCE SIGNS LIST

1: substrate
10: LED chip
10R: red micro-LED chip
10G: green micro-LED chip
10B: blue micro-LED chip
20: wavelength conversion layer
20R: red wavelength conversion layer
20G: green wavelength conversion layer
20B: blue wavelength conversion layer
30: micro-LED
40: first contact electrode
50, 52: light blocking component
51: photosensitive resin composition
60A, 60B, 60C: half-tone mask
61: transparent substrate
62: light blocker
63: slit
64*a*, 64*b*, 64*c*, 64*d*: evaporated metal
65*a*, 65*b*, 65*c*, 65*d*: semi-transparent film
100: array substrate
101: circuit board
110: second contact electrode
120: insulating film
130: resist
140: mask
201: substrate
202: adhesive layer
203: head
204: bonding material
1000: micro-LED panel
1001: gate line
1002: source line
1003: anode power line
1004: cathode power line
1005: switching transistor
1005D, 1006D: drain electrode

1005G, 1006G: gate electrode
1005S, 1006S: source electrode
1006: drive transistor
1007: storage capacitor

What is claimed is:

1. A method of producing a micro-LED panel, the method comprising:

producing a micro-LED chip including a micro-LED, a first contact electrode electrically connected to the micro-LED, and a light blocking component surrounding the micro-LED;

producing an array substrate including a switching element, a second contact electrode electrically connected to the switching element, and an insulating film formed on the second contact electrode with part of the second contact electrode being exposed; and placing the micro-LED chip on the array substrate, the light blocking component including a bump with an inclined surface, the insulating film including a dent with an inclined surface, the placing of the micro-LED chip including electrically connecting the first contact electrode to the second contact electrode by making the bump of the light blocking component opposite to the dent of the insulating film.

2. The method of producing a micro-LED panel according to claim 1, wherein the producing of a micro-LED chip includes producing the light blocking component with an inclined surface by overlaying a half-tone mask whose transmittance changes in stages on a photosensitive resin composition and exposing the photosensitive resin composition to light through the half-tone mask.

3. The method of producing a micro-LED panel according to claim 2, wherein the half-tone mask is provided with light blockers and slits each formed between the light blockers, and the light blockers include light blockers with different widths.

4. The method of producing a micro-LED panel according to claim 2, wherein the half-tone mask includes regions with different evaporated metal densities.

5. The method of producing a micro-LED panel according to claim 2, wherein the half-tone mask includes a stack of semi-transparent films.

6. The method of producing a micro-LED panel according to claim 1, wherein the micro-LED chip includes a wavelength conversion layer, the micro-LED, and the first contact electrode in the stated order.

7. The method of producing a micro-LED panel according to claim 1, wherein the micro-LED chip includes the micro-LED, a wavelength conversion layer, and the first contact electrode in the stated order.

* * * * *